United States Patent
Chisaka et al.

(10) Patent No.: US 9,891,527 B2
(45) Date of Patent: Feb. 13, 2018

(54) DEVELOPING SOLUTION AND DEVELOPMENT PROCESSING METHOD OF PHOTOSENSITIVE RESIN COMPOSITION

(71) Applicant: Tokyo Ohka Kogyo Co., Ltd., Kawasaki-shi (JP)

(72) Inventors: Hiroki Chisaka, Kawasaki (JP); Kunihiro Noda, Kawasaki (JP); Dai Shiota, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/168,305

(22) Filed: Jan. 30, 2014

(65) Prior Publication Data
US 2014/0234784 A1 Aug. 21, 2014

(30) Foreign Application Priority Data
Feb. 18, 2013 (JP) .................. 2013-028769

(51) Int. Cl.
| | | |
|---|---|---|
| *G03F 7/32* | (2006.01) | |
| *G03F 7/023* | (2006.01) | |
| *G03F 7/038* | (2006.01) | |
| *G03F 7/40* | (2006.01) | |

(52) U.S. Cl.
CPC ............ *G03F 7/325* (2013.01); *G03F 7/0233* (2013.01); *G03F 7/0387* (2013.01); *G03F 7/40* (2013.01)

(58) Field of Classification Search
CPC ................. G03F 7/32; G03F 7/0387
USPC .......................................... 430/434
See application file for complete search history.

(56) References Cited

U.S. PATENT DOCUMENTS

| | | | | |
|---|---|---|---|---|
| 5,589,324 | A | * | 12/1996 | Wexler .......................... 430/529 |
| 2003/0165777 | A1 | * | 9/2003 | Teng ..................... B41C 1/1008 430/292 |
| 2008/0233513 | A1 | * | 9/2008 | Komatsu et al. .......... 430/270.1 |
| 2009/0004597 | A1 | * | 1/2009 | Ueoka ..................... C03C 3/066 430/270.1 |

FOREIGN PATENT DOCUMENTS

| | | |
|---|---|---|
| JP | 3358280 B | 10/2002 |
| JP | 4164750 B | 8/2008 |

\* cited by examiner

*Primary Examiner* — Daborah Chacko Davis
(74) *Attorney, Agent, or Firm* — Knobbe, Martens, Olson & Bear, LLP

(57) ABSTRACT

A developing solution for a polyimide precursor containing N,N,N',N'-tetramethylurea and a lower alcohol having 1 to 5 carbon atoms. The developing solution increases a development margin and results in little or no decrease of the film thickness of a polyimide-based resin film. A development processing method of a photosensitive polyimide resin composition including developing a photosensitive polyimide precursor resin composition, at least a part of which is exposed, with the developing solution; and a pattern formation method including forming a coating film or molding including a photosensitive polyimide precursor resin composition, selectively exposing the coating film or molding, and developing the exposed coating film or molding by the development processing method.

20 Claims, No Drawings

US 9,891,527 B2

DEVELOPING SOLUTION AND DEVELOPMENT PROCESSING METHOD OF PHOTOSENSITIVE RESIN COMPOSITION

CROSS-REFERENCE TO RELATED APPLICATIONS

This application claims priority to Japanese Patent Application No. 2013-028769, filed Feb. 18, 2013, the content of which is incorporated herein by reference.

TECHNICAL FIELD

The present invention relates to a developing solution for polyimide precursor, a development processing method of a photosensitive polyimide resin composition using this developing solution for polyimide precursor, and a pattern formation method adopting this development processing method.

RELATED ART

Polyimide-based resins are used for interlayer insulating films or surface protective films of semiconductor devices and the like. Conventionally, the pattern formation of a polyimide-based resin film is carried out by perforating (patterning) a polyimide-based resin film with an etching liquid such as an alkaline aqueous solution and a hydrazine-based solution by using a mask material composed of a photoresist film and then processing the photoresist film which has become unnecessary, with a stripping solution to strip and remove it.

But, in recent years, a photosensitive polyimide precursor in which pattern forming ability is given to a polyimide precursor to make the formation and stripping and removal of a photoresist film unnecessary is used to attempt to shorten the process. For the pattern formation of such a polyimide precursor, in general, developing solutions for photosensitive polyimide precursor composed mainly of a bipolar aprotic polar organic solvent such as N-methyl-2-pyrrolidone, N,N-dimethylacetamide, and dimethyl sulfoxide are used (see, for example, Patent Documents 1 and 2).

DOCUMENT OF RELATED ART

Patent Document

Patent Document 1: Japanese Patent No. 3358280
Patent Document 2: Japanese Patent No. 4164750

SUMMARY OF THE INVENTION

The conventional developing solutions for polyimide precursor disclosed in Patent Document 1 or 2 have a strong affinity for not only a polyimide precursor before exposure but a polyimide having a crosslinking structure formed by exposure. Accordingly, dissolution is easy to proceed in not only an unexposed area but an exposed area which is originally insoluble during the development. As a result, the conventional developing solutions for polyimide precursor involve such problems that a time width during which a good development processing can be carried out, namely a development margin is easy to become small; and that the film thickness of a polyimide-based resin film is easy to decrease in a development step.

Furthermore, in recent years, N-methyl-2-pyrrolidone, N,N-dimethylformamide, and N,N-dimethylacetamide have been designated as Substances of Very High Concern (SVHC) due to their strong toxicity. The conventional developing solutions for polyimide precursor using such a bipolar aprotic polar organic solvent also involve a safety problem.

Under these circumstances of the related art, the present invention has been made, and an object thereof is to provide a developing solution for polyimide precursor which is able to make a development margin large, hardly causes a decrease of the film thickness of a polyimide-based resin film in a development step, and has high safety; a development processing method of a photosensitive polyimide resin composition with this developing solution for polyimide precursor; and a pattern formation method adopting this development processing method.

In order to solve the above-described problems, the present inventors made extensive and intensive investigations. As a result, it has been found that the above-described problems can be solved by using N,N,N',N'-tetramethylurea as a bipolar aprotic polar organic solvent in a developing solution for polyimide precursor, leading to accomplishment of the present invention. Specifically, the present invention provides the following.

A first embodiment of the present invention is concerned with a developing solution for polyimide precursor, including (a) N,N,N',N'-tetramethylurea and (b) a lower alcohol having 1 to 5 carbon atoms.

In the case where a polyimide precursor is a photosensitive polyimide precursor which is imidized by the action of light, a second embodiment of the present invention is concerned with a development processing method of a photosensitive polyimide resin composition, which includes a step of developing a photosensitive polyimide precursor resin composition, at least a part of which is exposed, with the above-described developing solution for polyimide precursor.

A third embodiment of the present invention is concerned with a pattern formation method including a step of forming a coating film or molding composed of a photosensitive polyimide precursor resin composition, a step of selectively exposing the coating film or molding, and a step of developing the exposed coating film or molding by the above-described development processing method.

According to the present invention, a developing solution for polyimide precursor which is able to make a development margin large, hardly causes a decrease of the film thickness of a polyimide-based resin film in a development step, and has high safety; a development processing method of a photosensitive polyimide resin composition with this developing solution for polyimide precursor; and a pattern formation method adopting this development processing method can be provided.

DETAILED DESCRIPTION OF THE INVENTION

The embodiments of the present invention are hereunder described in detail. First of all, the developing solution for polyimide precursor according to the present invention is described, and subsequently, the development processing method of a photosensitive polyimide resin composition and the pattern formation method according to the present invention are described.

<Developing Solution for Polyimide Precursor>

The developing solution for polyimide precursor according to the present invention at least contains (a) N,N,N',N'-tetramethylurea and (b) a lower alcohol having 1 to 5 carbon atoms.

(a) N,N,N',N'-Tetramethylurea

The N,N,N',N'-tetramethylurea (a) is a component which gives developability to the developing solution for polyimide precursor according to the present invention, and similar to the bipolar aprotic polar organic solvents which are contained in the conventional developing solutions for polyimide precursor, such as N-methyl-2-pyrrolidone, N,N-dimethylformamide, and N,N-dimethylacetamide, the N,N,N',N'-tetramethylurea (a) may be used for the development processing of a polyimide precursor. In addition, when the N,N,N',N'-tetramethylurea (a) is contained in the developing solution for polyimide precursor, in the development step with such a developing solution, the development margin can be made large, and a decrease of the film thickness of a polyimide-based resin film can be made to be hardly caused. Furthermore, the N,N,N',N'-tetramethylurea (a) is not designated as Substances of Very High Concern (SVHC) and is a compound with low toxicity, and therefore, it is high in safety.

A blending amount of the N,N,N',N'-tetramethylurea (a) is preferably 10 to 99 mass parts, and more preferably 20 to 98 mass parts based on 100 mass parts of the developing solution for polyimide precursor according to the present invention. When the blending amount of the N,N,N',N'-tetramethylurea (a) falls within the foregoing range, the resulting developing solution is easy to become one having an excellent developing effect, effectively exhibits permeability into the film and solubility of the film, and hardly causes cracking on the film.

(b) Lower Alcohol Having 1 to 5 Carbon Atoms

The lower alcohol (b) having 1 to 5 carbon atoms is used as a solvent component in the developing solution for polyimide precursor according to the present invention. Examples of the lower alcohol (b) having 1 to 5 carbon atoms include alcohols having an alkyl group having 1 to 5 carbon atoms, an alkenyl group having 1 to 5 carbon atoms, or an alkynyl group having 1 to 5 carbon atoms. More specifically, examples thereof include methyl alcohol, ethyl alcohol, propyl alcohol, isopropyl alcohol, butyl alcohol, isobutyl alcohol, sec-butyl alcohol, n-amyl alcohol, isoamyl alcohol, allyl alcohol, and propargyl alcohol, with methyl alcohol and isopropyl alcohol being especially suitable. The lower alcohol (b) having 1 to 5 carbon atoms may be used solely or in admixture of two or more kinds thereof.

A blending amount of the lower alcohol (b) having 1 to 5 carbon atoms is preferably 1 to 90 mass parts, and more preferably 2 to 80 mass parts based on 100 mass parts of the developing solution for polyimide precursor according to the present invention. When the blending amount of the lower alcohol (b) having 1 to 5 carbon atoms falls within the foregoing range, such is preferable in view of the following points. First, since the permeability into the film of the resulting developing solution is hardly lowered, the solubility of the film is hardly lowered, and cracking is hardly caused on the film. Secondly, the resin film or resin molding after the development processing hardly causes whitening, and a pattern shape thereof is easy to become good. Thirdly, the development processing becomes easier in view of the foregoing first and second points.

(c) Glycol and/or Glycol Ether

The developing solution for polyimide precursor according to the present invention may contain (c) a glycol and/or a glycol ether. When the developing solution for polyimide precursor according to the present invention contains the glycol and/or glycol ether (c), the in-plane dimensional uniformity of the resin film or resin molding after the development processing is easily enhanced.

Examples of the glycol and/or glycol ether (c) include compounds represented by the following formula (I). Each of the glycol and the glycol ether which are used as the component (c) may be used solely or in admixture of two or more kinds thereof.

$$\text{HO}-R^A-O-R^B \qquad (I)$$

In the foregoing formula (I), $R^A$ represents an alkylene group having 2 to 5 carbon atoms; and $R^B$ represents a hydrogen atom, an alkyl group having 1 to 4 carbon atoms, a hydroxyalkyl group having 1 to 4 carbon atoms, or an optionally substituted aromatic group. Examples of the aromatic group include an aryl group having 6 to 10 carbon atoms and an aralkyl group having 7 to 11 carbon atoms. Examples of the substituent include a halogen atom, an amino group, and a carboxyl group.

Specific examples of the glycol and/or glycol ether (c) include glycols such as ethylene glycol, propylene glycol, butylene glycol, diethylene glycol, dipropylene glycol, and dibutylene glycol; and glycol ethers such as ethylene glycol methyl ether, ethylene glycol ethyl ether, ethylene glycol propyl ether, ethylene glycol butyl ether, propylene glycol methyl ether, propylene glycol ethyl ether, propylene glycol propyl ether, propylene glycol butyl ether, butylene glycol methyl ether, butylene glycol ethyl ether, butylene glycol propyl ether, butylene glycol butyl ether, ethylene glycol phenyl ether, propylene glycol phenyl ether, and butylene glycol phenyl ether.

A blending amount of the glycol and/or glycol ether (c) is preferably 0.1 to 20 mass parts, and more preferably 1 to 10 mass parts based on 100 mass parts of the developing solution for polyimide precursor according to the present invention. When the blending amount of the glycol and/or glycol ether (c) falls within the foregoing range, first, since the component (c) hardly becomes a poor solvent for the polyimide precursor, the resin film or resin molding after the development processing hardly causes whitening, and a pattern shape thereof is easy to become good; and secondly, the in-plane dimensional uniformity of the resin film or resin molding after the development processing is easily enhanced.

[Other Components]

The developing solution for polyimide precursor according to the present invention may contain a solvent other than those described above within the range where the developability and the like are not adversely affected. Suitable examples of such a solvent include alcohols, esters, hydrocarbons, and ethers.

[Polyimide Precursor]

In this specification, the polyimide precursor which is a subject to which the developing solution for polyimide precursor according to the present invention is applied refers to a compound which gives a polyimide resin by cyclization (imidization) by heating or with a catalyst. The polyimide precursor may be a sole compound or a mixture of two or more kinds thereof. Examples of the polyimide precursor include polyamic acids, and a polyamic acid represented by the following formula (1) is preferable.

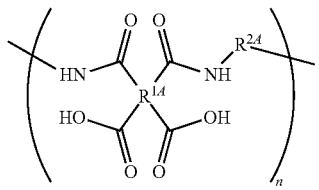

(1)

In the formula, $R^{1A}$ represents a tetravalent organic group; $R^{2A}$ represents a divalent organic group; and n represents a repeating number of the constituent unit expressed within the parenthesis.

In the formula (1), $R^{1A}$ and $R^{2A}$ are a tetravalent organic group and a divalent organic group, respectively, and the carbon number thereof is preferably 2 to 50, and more preferably 2 to 30. Each of $R^{1A}$ and $R^{2A}$ may be either an aliphatic group or an aromatic group, or may be a group composed of a combination of these structures. Each of $R^{1A}$ and $R^{2A}$ may also contain, in addition to the carbon atom and the hydrogen atom, a halogen atom, an oxygen atom, a nitrogen atom, and a sulfur atom. In the case where each of $R^{1A}$ and $R^{2A}$ contains an oxygen atom, a nitrogen atom, or a sulfur atom, the oxygen atom, the nitrogen atom, or the sulfur atom may be contained as a group selected from a nitrogen-containing heterocyclic group, —CONH—, —NH—, —N=N—, —CH=N—, —COO—, —O—, —CO—, —SO—, —SO$_2$—, —S—, and —S—S—, in $R^{1A}$ and $R^{2A}$, respectively. It is more preferable that the oxygen atom or the sulfur atom is contained as a group selected from —O—, —CO—, —SO—, —SO$_2$—, —S—, and —S—S—, in $R^{1A}$ and $R^{2A}$, respectively.

When the polyamic acid represented by the foregoing formula (1) is subjected to cyclization by heating or with a catalyst, a polyimide resin represented by the following formula (2) is obtained.

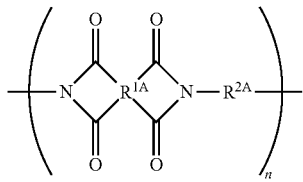

(2)

In the formula, $R^{1A}$ and $R^{2A}$ are the same as defined in the formula (1); and n represents a repeating number of the constituent unit expressed within the parenthesis.

The polyamic acid represented by the foregoing formula (1) is obtained by allowing a tetracarboxylic acid dianhydride and a diamine to react with each other in a solvent. The tetracarboxylic acid dianhydride and the diamine which work as synthetic raw materials for the polyamic acid are not particularly limited so long as they are able to form a polyamic acid through a reaction between an acid anhydride group and an amino group.

In synthesizing a polyamic acid, though the use amounts of the tetracarboxylic acid dianhydride and the diamine are not particularly limited, the diamine is used in an amount of preferably 0.50 to 1.50 moles, more preferably 0.60 to 1.30 moles, and especially preferably 0.70 to 1.20 moles per mole of the tetracarboxylic acid dianhydride.

The tetracarboxylic acid dianhydride can be properly selected among tetracarboxylic acid dianhydrides which have hitherto been used as a synthetic raw material for polyamic acids. Though the tetracarboxylic acid dianhydride may be either an aromatic tetracarboxylic acid dianhydride or an aliphatic tetracarboxylic acid dianhydride, it is preferably an aromatic tetracarboxylic acid dianhydride from the standpoint of heat resistance of the resulting polyimide resin. The tetracarboxylic acid dianhydride may also be used in combination of two or more kinds thereof.

Suitable specific examples of the aromatic tetracarboxylic acid dianhydride include pyromellitic dianhydride, 3,3',4,4'-biphenyltetracarboxylic dianhydride, 2,3,3',4'-biphenyltetracarboxylic dianhydride, 2,2',6,6'-biphenyltetracarboxylic dianhydride, 3,3',4,4'-benzophenonetetracarboxylic dianhydride, 4,4'-oxydiphthalic dianhydride, and 3,3',4,4'-diphenylsulfonetetracarboxylic dianhydride. Of these, pyromellitic dianhydride, 3,3',4,4'-biphenyltetracarboxylic dianhydride, and 4,4'-oxydiphthalic dianhydride are preferable from the standpoints of costs, easiness of availability, and the like.

The diamine can be properly selected among diamines which have hitherto been used as a synthetic raw material for polyamic acids. Though the diamine may be either an aromatic diamine or an aliphatic diamine, it is preferably an aromatic diamine from the standpoint of heat resistance of the resulting polyimide resin. The diamine may also be used in combination of two or more kinds thereof.

Suitable specific examples of the aromatic diamine include p-phenylenediamine, m-phenylenediamine, 2,4-diaminotoluene, 4,4'-diaminobiphenyl, 4,4'-diamino-2,2'-bis(trifluoromethyl)biphenyl, 3,3'-diaminodiphenylsulfone, 4,4'-diaminodiphenylsulfone, 4,4'-diaminodiphenylsulfide, 4,4'-diaminodiphenylmethane, 4,4'-diaminodiphenyl ether, 3,4'-diaminodiphenyl ether, 3,3'-diaminodiphenyl ether, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(4-aminophenoxy)phenyl]hexafluoropropane, and 2,2-bis(3-amino-4-hydroxyphenyl)hexafluoropropane. Of these, 4,4'-diaminodiphenyl ether and 2,2-bis(3-amino-4-hydroxyphenyl)hexafluoropropane are preferable from the standpoints of costs, easiness of availability, and the like.

The reaction between the tetracarboxylic acid dianhydride and the diamine is in general carried out in an organic solvent. The organic solvent which is used for the reaction between the tetracarboxylic acid dianhydride and the diamine is not particularly limited so long as it is able to dissolve the tetracarboxylic acid dianhydride and the diamine, and it does not react with the tetracarboxylic acid dianhydride and the diamine. The organic solvent may be used solely or in admixture of two or more kinds thereof.

Examples of the organic solvent which is used for the reaction between the tetracarboxylic acid dianhydride and the diamine include nitrogen-containing polar solvents such as N-methyl-2-pyrrolidone, N,N-dimethylacetamide, N,N-diethylacetamide, N,N-dimethylformamide, N,N-diethylformamide, N-methylcaprolactam, and N,N,N',N'-tetramethylurea; lactone-based polar solvents such as β-propiolactone, γ-butyrolactone, γ-valerolactone, δ-valerolactone, γ-caprolactone, and ε-caprolactone; dimethyl sulfoxide; acetonitrile; fatty acid esters such as ethyl lactate and butyl lactate;

and ethers such as diethylene glycol dimethyl ether, diethylene glycol diethyl ether, dioxane, tetrahydrofuran, methyl cellosolve acetate, and ethyl cellosolve acetate.

Of these organic solvents, nitrogen-containing polar solvents such as N-methyl-2-pyrrolidone, N,N-dimethylacetamide, N,N-diethylacetamide, N,N-dimethylformamide, N,N-diethylformamide, N-methylcaprolactam, and N,N,N',N'-tetramethylurea are preferable from the standpoint of solubility of the formed polyamic acid or polyimide resin; and N,N,N',N'-tetramethylurea is more preferable from the standpoint of safety.

The above-described polyimide precursor is preferably a photosensitive polyimide precursor which is imidized by the action of light. The above-describe photosensitive polyimide precursor is a negative type photosensitive polyimide precursor because a portion where light hits is imidized to become insoluble in the developing solution. The photosensitive polyimide precursor is obtained by, for example, adding a photosensitizer to the polyimide precursor. Examples of the photosensitizer include a photobase generator and a photoacid generator. When the polyimide precursor is exposed in the presence of a photobase generator or a photoacid generator, the photobase generator or the photoacid generator is decomposed to generate a base or an acid, and the generated base or acid acts as an imidization catalyst on the polyimide precursor, thereby accelerating the cyclization of the polyimide precursor.

The photobase generator is not particularly limited, and a variety of compounds including those which are known can be used. Examples of the photobase generator which is suitable include a compound represented by the following formula (3). The compound represented by the following formula (3) is decomposed by the action of light, thereby generating an imidazole compound represented by the following formula (4). This imidazole compound acts as a basic imidization catalyst, thereby accelerating the cyclization of the polyimide precursor.

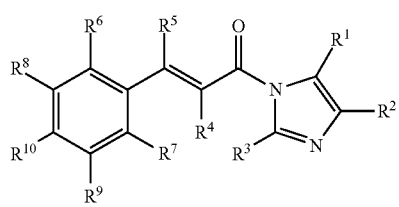

(3)

In the formula, each of $R^1$, $R^2$, and $R^3$ independently represents a hydrogen atom, a halogen atom, a hydroxyl group, a mercapto group, a sulfide group, a silyl group, a silanol group, a nitro group, a nitroso group, a phosphino group, a sulfonate group, a phosphinyl group, a phosphonate group, or an organic group; each of $R^4$ and $R^5$ independently represents a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group; each of $R^6$, $R^7$, $R^8$, $R^9$, and $R^{10}$ independently represents a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group; and two or more of $R^6$, $R^7$, $R^8$, $R^9$, and $R^{10}$ may be bonded to each other to form a cyclic structure and may contain a bond of a hetero group.

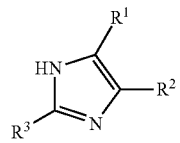

(4)

In the formula, $R^1$, $R^2$ and $R^3$ are the same as defined in the formula (3).

In the formulae (3) and (4), examples of the organic group represented by $R^1$, $R^2$, or $R^3$ include an alkyl group, an alkenyl group, a cycloalkyl group, a cycloalkenyl group, an aryl group, and an aralkyl group. This organic group may contain a hetero atom. In addition, this organic group may be linear, branched, or cyclic. Though this organic group is in general monovalent, it may be divalent or multivalent in the case of forming a cyclic structure, or the like.

$R^1$ and $R^2$ may be bonded to each other to form a cyclic structure and may contain a bond of a hetero atom. Examples of the cyclic structure include a heterocycloalkyl group and a heteroaryl group, and the cyclic structure may also be a condensed ring.

In the case where the organic group represented by $R^1$, $R^2$, or $R^3$ contains a hetero atom, examples of the hetero atom include an oxygen atom, a nitrogen atom, and a silicon atom. Specific examples of the bond containing a hetero atom include an ether bond, a thioether bond, a carbonyl bond, a thiocarbonyl bond, an ester bond, an amide bond, a urethane bond, an imino bond (—N=C(—R)— or —C(=NR)— (wherein R represents a hydrogen atom or an organic group), hereinafter the same), a carbonate bond, a sulfonyl bond, a sulfinyl bond, and an azo bond. Above all, an ether bond, a thioether bond, a carbonyl bond, a thiocarbonyl bond, an ester bond, an amide bond, a urethane bond, an imino bond, a carbonate bond, a sulfonyl bond, and a sulfinyl bond are preferable from the viewpoint of heat resistance of the imidazole compound.

The hydrogen atom which is contained in the group other than the organic group, as represented by $R^1$, $R^2$, or $R^3$ may be substituted with a hydrocarbon group. This hydrocarbon group may be linear, branched, or cyclic.

Each of $R^1$, $R^2$, and $R^3$ is independently preferably a hydrogen atom, an alkyl group having 1 to 12 carbon atoms, an aryl group having 1 to 12 carbon atoms, an alkoxy group having 1 to 12 carbon atoms, or a halogen atom, and more preferably a hydrogen atom. When all of $R^1$, $R^2$, and $R^3$ are a hydrogen atom, the imidazole compound represented by the formula (4) has a simple structure with a small steric hindrance, and therefore, it is able to easily act as the imidization catalyst on the polyimide precursor.

In the formula (3), examples of the organic group represented by $R^4$ or $R^5$ include the same groups as those exemplified for $R^1$, $R^2$, and $R^3$. Similar to the case of $R^1$, $R^2$, and $R^3$, this organic group may contain a hetero atom. In addition, this organic group may be linear, branched, or cyclic.

Each of $R^4$ and $R^5$ is independently preferably a hydrogen atom, an alkyl group having 1 to 10 carbon atoms, a cycloalkyl group having 4 to 13 carbon atoms, a cycloalkenyl group having 4 to 13 carbon atoms, an aryloxyalkyl group having 7 to 16 carbon atoms, an aralkyl group having 7 to 20 carbon atoms, a cyano group-containing alkyl group having 2 to 11 carbon atoms, a hydroxyl group-containing alkyl group having 1 to 10 carbon atoms, an alkoxy group having 1 to 10 carbon atoms, an amide group having 2 to 11 carbon atoms, an alkylthio group having 1 to 10 carbon atoms, an acyl group having 1 to 10 carbon atoms, an ester group having 2 to 11 carbon atoms (—COOR or —OCOR (wherein R represents a hydrocarbon group)), an aryl group having 6 to 20 carbon atoms, an aryl group having 6 to 20 carbon atoms, on which an electron donating group and/or an electron withdrawing group is substituted, or a benzyl group, a cyano group, or a methylthio group, on each of which an electron donating group and/or an electron withdrawing group is substituted. More preferably, both $R^4$ and $R^5$ are a hydrogen atom; or $R^4$ is a methyl group, and $R^5$ is a hydrogen atom.

In the formula (3), examples of the organic group represented by $R^6$, $R^7$, $R^8$, $R^9$, or $R^{10}$ include the same groups as those exemplified for $R^1$, $R^2$, and $R^3$. Similar to the case of $R^1$, $R^2$, and $R^3$, this organic group may contain a hetero atom. In addition, this organic group may be linear, branched, or cyclic.

Two or more of $R^6$, $R^7$, $R^8$, $R^9$, and $R^{10}$ may be bonded to each other to form a cyclic structure and may contain a bond of a hetero group. Examples of the cyclic structure include a heterocycloalkyl group and a heteroaryl group, and the cyclic structure may also be a condensed ring. For example, two or more of $R^6$, $R^7$, $R^8$, $R^9$, and $R^{10}$ may be bonded to each other to form a condensed ring such as naphthalene, anthracene, phenanthrene, and indene, while sharing the atom of the benzene ring to which $R^6$, $R^7$, $R^8$, $R^9$, and $R^{10}$ bond.

Each of $R^6$, $R^7$, $R^8$, $R^9$, and $R^{10}$ is independently preferably a hydrogen atom, an alkyl group having 1 to 10 carbon atoms, a cycloalkyl group having 4 to 13 carbon atoms, a cycloalkenyl group having 4 to 13 carbon atoms, an aryloxyalkyl group having 7 to 16 carbon atoms, an aralkyl group having 7 to 20 carbon atoms, a cyano group-containing alkyl group having 2 to 11 carbon atoms, a hydroxyl group-containing alkyl group having 1 to 10 carbon atoms, an alkoxy group having 1 to 10 carbon atoms, an amide group having 2 to 11 carbon atoms, an alkylthio group having 1 to 10 carbon atoms, an acyl group having 1 to 10 carbon atoms, an ester group having 2 to 11 carbon atoms, an aryl group having 6 to 20 carbon atoms, an aryl group having 6 to 20 carbon atoms, on which an electron donating group and/or an electron withdrawing group is substituted, or a benzyl group, a cyano group, a methylthio group, or a nitro group, on each of which an electron donating group and/or an electron withdrawing group is substituted.

In addition, the case where two or more of $R^6$, $R^7$, $R^8$, $R^9$, and $R^{10}$ are bonded to each other to form a condensed ring such as naphthalene, anthracene, phenanthrene, and indene, while sharing the atom of the benzene ring to which $R^6$, $R^7$, $R^8$, $R^9$, and $R^{10}$ bond is also preferable in view of the fact that the absorption wavelength is made longer.

A compound in which a skeleton derived from the imidazole compound represented by the formula (4) in the compound represented by the formula (3) is substituted into a skeleton derived from an amine has hitherto been blended in a photosensitive composition and generates an amine by the action of light. With respect to such a compound which has hitherto been blended in a photosensitive compound, the compound represented by the formula (3) can be obtained by substituting a skeleton derived from an amine generated at the time of exposure into a skeleton derived from the imidazole compound represented by the formula (4).

Among the compounds represented by the foregoing formula (3), a compound represented by the following formula (5) is preferable.

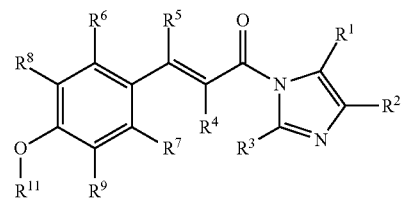

(5)

In the formula, $R^1$, $R^2$, and $R^3$ are the same as defined in the formulae (3) and (4); $R^4$ to $R^9$ are the same as defined in the formula (4); $R^{11}$ represents a hydrogen atom or an organic group; $R^6$ and $R^7$ do not represent a hydroxyl group; and two or more of $R^6$, $R^7$, $R^8$, and $R^9$ may be bonded to each other to form a cyclic structure and may contain a bond of a hetero atom.

The compound represented by the formula (5) has a substituent —O—$R^{11}$, and therefore, it is excellent in the solubility in an organic solvent.

In the formula (5), in the case where $R^{11}$ is an organic group, examples of the organic group include the same groups as those exemplified for $R^1$, $R^2$, and $R^3$. This organic group may contain a hetero atom. In addition, this organic group may be linear, branched, or cyclic. $R^{11}$ is preferably a hydrogen atom or an alkyl group having 1 to 12 carbon atoms, and more preferably a methyl group.

The photoacid generator is not particularly limited, and a variety of photoacid generators can be used. Suitable examples of the photoacid generator include known acid generators such as onium salts, diazomethane derivatives, glyoxime derivatives, bissulfone derivatives, β-ketosulfone derivatives, disulfone derivatives, nitrobenzyl sulfonate derivatives, sulfonic acid ester derivatives, and sulfonic acid ester derivatives of an N-hydroxyimide compound.

<Development Processing Method of Photosensitive Polyimide Resin Composition>

In the case where the polyimide precursor is a photosensitive polyimide precursor which is imidized by the action of light, the development processing method of a photosensitive polyimide resin composition according to the present invention includes a step of developing a photosensitive polyimide precursor resin composition, at least a part of which is exposed, with the developing solution for polyimide precursor according to the present invention.

Examples of the above-described photosensitive polyimide precursor resin composition include a composition containing the above-described polyimide precursor and the above-described photosensitizer. The content of the photosensitizer in the photosensitive polyimide precursor resin composition is not particularly limited so long as the object of the present invention is not hindered. The content of the photosensitizer in the photosensitive polyimide precursor resin composition is preferably 1 to 50 mass parts, and more preferably 1 to 25 mass parts based on 100 mass parts of the polyimide precursor. The above-described photosensitive polyimide precursor resin composition may contain other components than the above-described components. Examples of other components include additives such as a surfactant, a plasticizer, a viscosity modifier, a defoaming agent, a colorant, a high resolution additive, an addition-polymerizable compound, a silane coupling agent, and a polyimide terminal blocking agent; and the solvents exemplified in the description regarding the polyimide precursor.

As the high resolution additive, a compound represented by the following formula is exemplified.

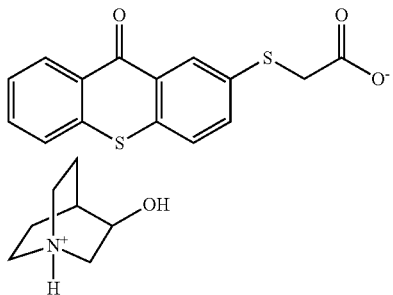

As the addition-polymerizable compound, a compound represented by the following formula is exemplified.

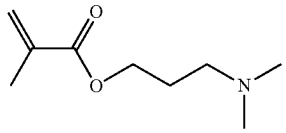

As the silane coupling agent, a compound represented by the following formula is exemplified.

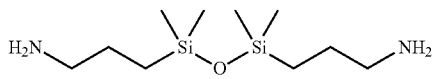

As the polyimide terminal blocking agent, a compound represented by the following formula is exemplified.

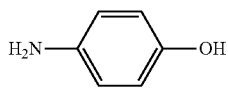

Examples of radial rays which are used for exposing at least a part of the photosensitive polyimide precursor resin composition include a low-pressure mercury vapor lamp, a high-pressure mercury vapor lamp, a metal halide lamp, ultraviolet rays emitted from a g-line stepper, an i-line stepper, or the like, an electron beam, and a laser beam. Though the amount of exposure varies with a light source to be used, a film thickness of the coating film, and the like, it is usually 1 to 1,000 $mJ/cm^2$, and preferably 10 to 500 $mJ/cm^2$.

In the photosensitive polyimide precursor resin composition, at least a part of which is exposed, in an exposed area, the imidization proceeds, whereby insolubilization in the developing solution for polyimide precursor according to the present invention occurs. On the other hand, an unexposed area is soluble in the developing solution for polyimide precursor according to the present invention. Accordingly, when the above-described photosensitive polyimide precursor resin composition is developed with the developing solution for polyimide precursor according to the present invention, the unexposed area is dissolved in the above-described developing solution and removed, whereas the exposed area is insoluble in the above-described developing solution, and therefore, it remains. Examples of the development method include a shower development method, a spray development method, a dip development method, and a puddle development method.

<Pattern Formation Method>

The pattern formation method according to the present invention includes a formation step of forming a coating film or molding composed of a photosensitive polyimide precursor resin composition, an exposure step of selectively exposing the coating film or molding, and a development step of developing the exposed coating film or molding by the development processing method according to the present invention. Each of the steps is hereunder described.

[Formation Step]

In the formation step, a coating film or molding composed of a photosensitive polyimide precursor resin composition is formed by coating the photosensitive polyimide precursor resin composition on the surface of a material to be coated or molding the photosensitive polyimide precursor resin composition by an appropriate molding method. Examples of the coating method include a dipping method, a spray method, a bar coating method, a roll coating method, a spin coating method, and a curtain coating method. A thickness of the coating film is not particularly limited. Typically, the thickness of the coating film is preferably 2 to 100 μm, and more preferably 3 to 50 μm. The thickness of the coating film can be properly controlled by adjusting a coating method or a solid content concentration or viscosity of the photosensitive polyimide precursor resin composition.

After the formation of a coating film or molding and before the transition into an exposure step, the coating film or molding may be heated for the purpose of removing the solvent in the coating film or molding. The heating temperature or heating time is not particularly limited so long as the thermal degradation or thermal decomposition is not caused in the components contained in the photosensitive polyimide precursor resin composition. In the case where a boiling point of the solvent in the coating film or molding is high, the coating film or molding may be heated under reduced pressure.

[Exposure Step]

In the exposure step, the coating film or molding obtained in the formation step is selectively exposed in a prescribed pattern. The selective exposure is in general carried out by using a mask with a prescribed pattern. The radial rays and amount of exposure used for the exposure are the same as those described in the explanation for the development processing method of the photosensitive polyimide resin composition.

[Development Step]

In the development step, the coating film or molding which has been selectively exposed in a prescribed pattern in the exposure step is developed by the development processing method according to the present invention. According to this, the unexposed area is dissolved in the developing solution for polyimide precursor according to the present invention and removed from the above-described selectively exposed coating film or molding. The development method is the same as that described in the explanation for the development processing method of the photosensitive polyimide resin composition.

[Heating Step]

The pattern formation method according to the present invention may include a heating step of heating the developed coating film or molding. According to this, in the case where the polyimide precursor remains in the coating film or molding even after the exposure step, the cyclization of such a polyimide precursor is further accelerated, whereby the imidization becomes more sufficient. Though the heating temperature is properly adjusted, it is, for example, set to 120 to 350° C., and preferably 150 to 350° C. When the polyimide precursor is heated at a temperature of such a range, the imidization can be more sufficiently carried out while suppressing the thermal degradation or thermal decomposition of the polyimide resin.

EXAMPLES

The present invention is hereunder described in more detail by reference to the following Examples, but it should not be construed that the scope of the present invention is limited to these Examples.

Examples 1 to 40 and Comparative Examples 1 to 21

In the Examples and Comparative Examples, the following component (a), component (a'), component (b), component (c), tetracarboxylic acid dianhydride, diamine, solvent, photosensitizer, and additive were used.

Component (a)
TMU: N,N,N',N'-Tetramethylurea
Component (a')
NMP: N-Methyl-2-pyrrolidone
Component (b)
MeOH: Methyl alcohol
iPrOH: Isopropanol
Component (c)
EGBE: Ethylene glycol monobutyl ether
DEG: Diethylene glycol
Tetracarboxylic acid dianhydride

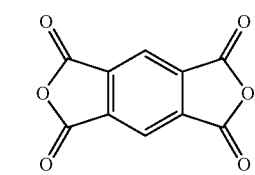

PMDA

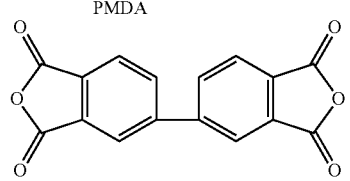

BPDA

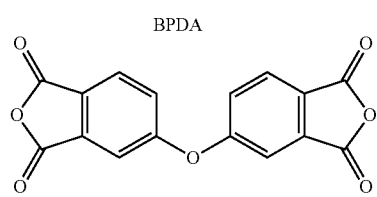

ODPA

Diamine

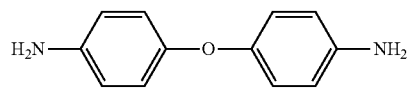

ODA

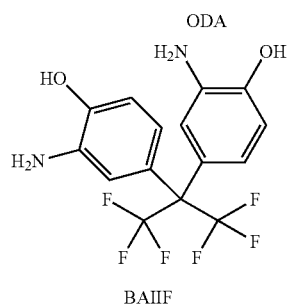

BAHF

Solvent
TMU: N,N,N',N'-Tetramethylurea
Photosensitizer

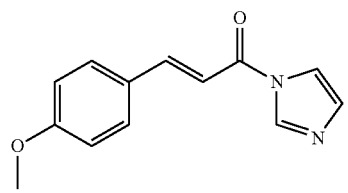

Photosensitizer 1

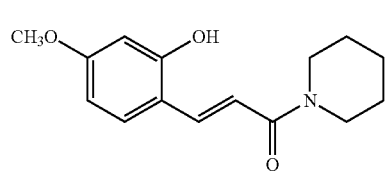

Photosensitizer 2

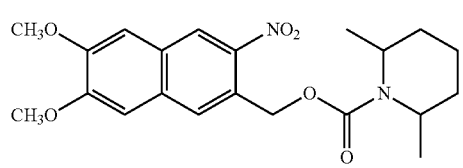

Photosensitizer 3

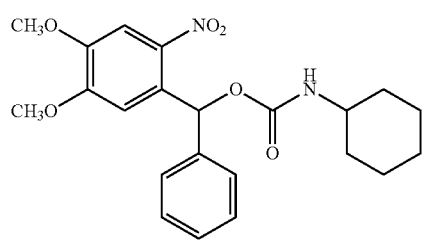

Photosensitizer 4

Photosensitizer 5: Bis(cyclopentadienyl)-bis-[2,6-difluoro-3-(pyri-1-yl)phenyl]titanium

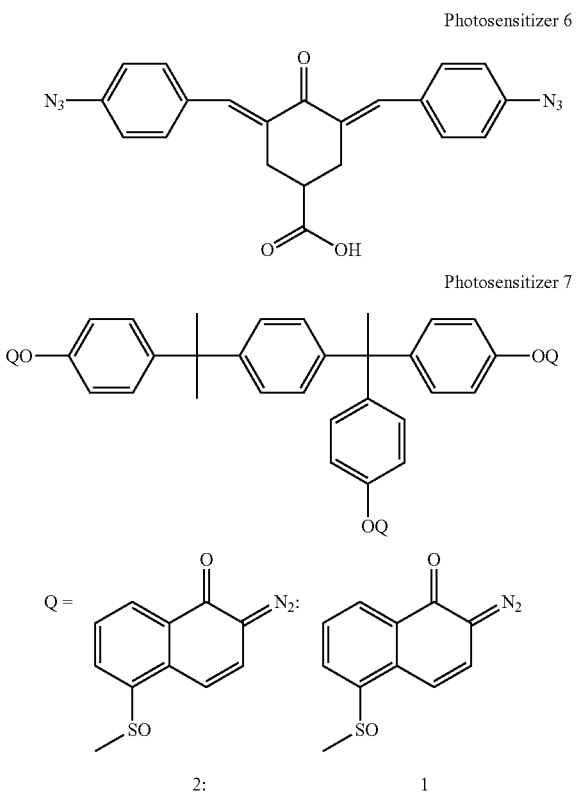

Photosensitizer 6

Photosensitizer 7

Additive

Additive 1

Additive 2

Additive 3

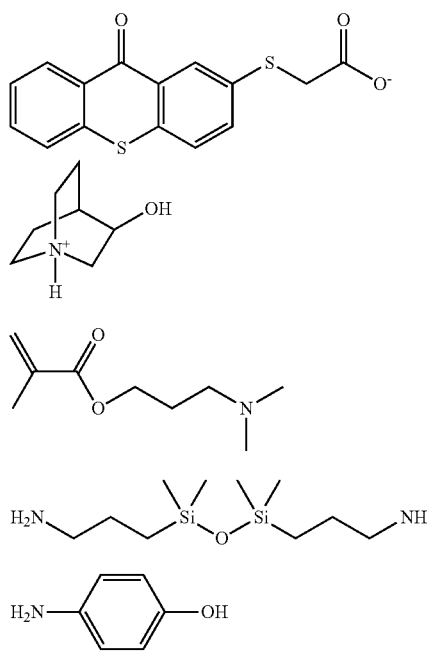

Additive 4

[Preparation of Developing Solution for Polyimide Precursor]

In a three-necked flask equipped with a stirrer, a thermometer, and a nitrogen inlet tube, the component (a) or component (a'), the component (b), and the component (c) of the kinds and amounts described in Tables 1 to 3 were charged and stirred for mixing at room temperature for one hour, thereby obtaining a developing solution for polyimide precursor.

[Preparation of Photosensitive Polyimide Precursor Resin Composition]

In a 5-liter separable flask equipped with a stirrer, a stirring blade, a reflux condenser, and a nitrogen gas inlet tube, the tetracarboxylic acid dianhydride, the diamine, the solvent, and the Additives 3 and 4 of the kinds and amounts described in Tables 1 to 3 were charged. Nitrogen was introduced into the flask from the nitrogen gas inlet tube, thereby rendering the inside of the flask in a nitrogen atmosphere. Subsequently, stirring was carried out at 50° C. for 20 hours while stirring the contents of the flask to allow the tetracarboxylic acid dianhydride and the diamine to react with each other, thereby obtaining a polyamic acid solution.

Subsequently, the sensitizer and the Additive 1 or 2 of the kinds and amounts described in Tables 1 to 3 were added to and mixed with 10 g of the resulting polyamic acid solution, and the mixture was then subjected to filter filtration, thereby obtaining a photosensitive polyimide precursor resin composition.

[Pattern Formation Method]

The resulting photosensitive polyimide precursor resin composition was dropped onto a silicon wafer, followed by spin coating. Subsequently, the resultant was heated at 90° C. for 120 seconds by using a hot plate, thereby forming a photosensitive polyimide precursor coating film having a film thickness of 12 μm. The above-described coating film was exposed with an i-line stepper for 0.5 second by using a mask with a line-and-space pattern. The exposed coating film was heated on a hotplate at 130° C. for 60 seconds and then subjected to puddle development with the above prepared developing solution for polyimide precursor for 60 seconds, followed by rinsing with ethanol.

[Evaluation]

(Environmental Toxicity)

The case where a substance which had been designated as Substances of Very High Concern (SVHC) as of Dec. 1, 2012 was not contained in the developing solution was decided to be low in the environmental toxicity (A); and the case where such a substance was contained in the developing solution was decided to be high in the environmental toxicity (C). The results are shown in Tables 1 to 3.

(Residual Film after Development)

A ratio of the film thickness after exposure with an i-line stepper and subsequent development for 60 seconds to the film thickness after spin coating was calculated. The case where the above-described ratio was 85% or more was decided to be good (A); the case where it was 80% or more and less than 85% was decided to be slightly good (B); and the case where it was less than 80% was decided to be poor (C). The results are shown in Tables 1 to 3.

(Development Margin)

After exposure with an i-line stepper and subsequent development for 60 seconds, the width of the formed lines was measured, and a minimum line width was determined. The case where the above-described minimum line width was not more than 10 μm was decided to be good (A); the case where it was more than 10 μm and not more than 15 μm was decided to be slightly good (B); and the case where it was more than 15 μm was decided to be poor (C). The results are shown in Tables 1 to 3.

TABLE 1

| | Materials of 100 mass parts of developing solution for polyimide precursor | | | | Materials of photosensitive polyimide precursor resin composition | | | | | Evaluation | | |
|---|---|---|---|---|---|---|---|---|---|---|---|---|
| Example | (a) TMU (mass parts) | (a') NMP (mass parts) | (b) (kind/ mass parts) | (c) (kind/ mass parts) | Tetra-carboxylic acid di-anhydride (kind/g) | Diamine (kind/g) | Solvent (kind/g) | Photo-sensi-tizer (kind/g) | Addi-tive (king/g) | Environ-mental toxic-ity | Residual film after develop-ment | Develop-ment margin |
| 1 | 75 | | MeOH/20 | EGBE/5 | PMDA/4.19 | ODA/3.92 | TMU/21 | 1/0.88 | | A | A | A |
| 2 | 75 | | iPrOH/20 | EGBE/5 | PMDA/4.19 | ODA/3.92 | TMU/21 | 1/0.88 | | A | A | A |
| 3 | 75 | | MeOH/20 | DEG/5 | PMDA/4.19 | ODA/3.92 | TMU/21 | 1/0.88 | | A | A | A |
| 4 | 75 | | iPrOH/20 | DEG/5 | PMDA/4.19 | ODA/3.92 | TMU/21 | 1/0.88 | | A | A | A |
| 5 | 75 | | MeOH/20 | EGBE/5 | BPDA/4.81 | ODA/3.34 | TMU/21 | 2/0.85 | | A | A | A |
| 6 | 75 | | iPrOH/20 | EGBE/5 | BPDA/4.81 | ODA/3.34 | TMU/21 | 2/0.85 | | A | A | A |
| 7 | 75 | | MeOH/20 | DEG/5 | BPDA/4.81 | ODA/3.34 | TMU/21 | 2/0.85 | | A | A | A |
| 8 | 75 | | iPrOH/20 | DEG/5 | BPDA/4.81 | ODA/3.34 | TMU/21 | 2/0.85 | | A | A | A |
| 9 | 75 | | MeOH/20 | EGBE/5 | BPDA/3.93 | ODA/2.73 | TMU/21 | 3/2.34 | | A | A | A |
| 10 | 75 | | iPrOH/20 | EGBE/5 | BPDA/3.93 | ODA/2.73 | TMU/21 | 3/2.34 | | A | A | A |
| 11 | 75 | | MeOH/20 | DEG/5 | BPDA/3.93 | ODA/2.73 | TMU/21 | 3/2.34 | | A | A | A |
| 12 | 75 | | iPrOH/20 | DEG/5 | BPDA/3.93 | ODA/2.73 | TMU/21 | 3/2.34 | | A | A | A |
| 13 | 75 | | MeOH/20 | EGBE/5 | BPDA/3.70 | ODA/2.57 | TMU/21 | 3/2.20 | 1/0.54 | A | A | A |
| 14 | 75 | | MeOH/20 | EGBE/5 | BPDA/3.92 | ODA/2.72 | TMU/21 | 4/2.36 | | A | A | A |
| 15 | 75 | | MeOH/20 | EGBE/5 | BPDA/4.31 | ODA/2.99 | TMU/21 | 5/1.44 | 2/0.25 | A | A | A |
| 16 | 75 | | MeOH/20 | EGBE/5 | BPDA/4.44 | ODA/3.09 | TMU/21 | 6/1.21 | 2/0.26 | A | A | A |
| 17 | 75 | | MeOH/20 | EGBE/5 | ODPA/3.00 | BAHF/3.06 | TMU/21 | 7/2.16 | 3/0.24 | A | A | A |
| 18 | 75 | | MeOH/20 | EGBE/5 | ODPA/3.04 | BAHF/3.66 | TMU/21 | 7/2.20 | 4/0.11 | A | A | A |
| 19 | 75 | | MeOH/25 | | PMDA/4.19 | ODA/3.92 | TMU/21 | 1/0.88 | | A | A | A |
| 20 | 75 | | MeOH/25 | | BPDA/4.81 | ODA/3.34 | TMU/21 | 2/0.85 | | A | A | A |
| 21 | 75 | | MeOH/25 | | BPDA/3.93 | ODA/2.73 | TMU/21 | 3/2.34 | | A | A | A |
| 22 | 75 | | MeOH/25 | | BPDA/3.70 | ODA/2.57 | TMU/21 | 3/2.20 | 1/0.54 | A | A | A |
| 23 | 75 | | MeOH/25 | | BPDA/3.92 | ODA/2.72 | TMU/21 | 4/2.36 | | A | A | A |
| 24 | 75 | | MeOH/25 | | BPDA/4.31 | ODA/2.99 | TMU/21 | 5/1.44 | 2/0.25 | A | A | A |
| 25 | 75 | | MeOH/25 | | BPDA/4.44 | ODA/3.09 | TMU/21 | 6/1.21 | 2/0.26 | A | A | A |
| 26 | 75 | | MeOH/25 | | ODPA/3.00 | BAHF/3.06 | TMU/21 | 7/2.16 | 3/0.24 | A | A | A |
| 27 | 75 | | MeOH/25 | | ODPA/3.04 | BAHF/3.66 | TMU/21 | 7/2.2 | 4/0.11 | A | A | A |

TABLE 2

| | Materials of 100 mass parts of developing solution for polyimide precursor | | | | Materials of photosensitive polyimide precursor resin composition | | | | | Evaluation | | |
|---|---|---|---|---|---|---|---|---|---|---|---|---|
| Example | (a) TMU (mass parts) | (a') NMP (mass parts) | (b) (kind/ mass parts) | (c) (kind/ mass parts) | Tetra-carboxylic acid di-anhydride (kind/g) | Diamine (kind/g) | Solvent (kind/g) | Photo-sensi-tizer (kind/g) | Addi-tive (king/g) | Environ-mental toxic-ity | Residual film after develop-ment | Develop-ment margin |
| 28 | 60 | | MeOH/30 | EGBE/10 | PMDA/4.19 | ODA/3.92 | TMU/21 | 1/0.88 | | A | A | A |
| 29 | 60 | | MeOH/30 | EGBE/10 | BPDA/4.81 | ODA/3.34 | TMU/21 | 2/0.85 | | A | A | A |
| 30 | 60 | | MeOH/30 | EGBE/10 | BPDA/3.93 | ODA/2.73 | TMU/21 | 3/2.34 | | A | A | A |
| 31 | 60 | | MeOH/30 | EGBE/10 | BPDA/3.70 | ODA/2.57 | TMU/21 | 3/2.20 | 1/0.54 | A | A | A |
| 32 | 60 | | MeOH/30 | EGBE/10 | BPDA/3.92 | ODA/2.72 | TMU/21 | 4/2.36 | | A | A | A |
| 33 | 60 | | MeOH/30 | EGBE/10 | BPDA/4.31 | ODA/2.99 | TMU/21 | 5/1.44 | 2/0.25 | A | A | A |
| 34 | 60 | | MeOH/30 | EGBE/10 | BPDA/4.44 | ODA/3.09 | TMU/21 | 6/1.21 | 2/0.26 | A | A | A |
| 35 | 60 | | MeOH/30 | EGBE/10 | ODPA/3.00 | BAHF/3.06 | TMU/21 | 7/2.16 | 3/0.24 | A | A | A |
| 36 | 60 | | MeOH/30 | EGBE/10 | ODPA/3.04 | BAHF/3.66 | TMU/21 | 7/2.20 | 4/0.11 | A | A | A |
| 37 | 97 | | MeOH/3 | | PMDA/4.19 | ODA/3.92 | TMU/21 | 1/0.88 | | A | A | A |
| 38 | 97 | | MeOH/3 | | BPDA/4.81 | ODA/3.34 | TMU/21 | 2/0.85 | | A | A | A |
| 39 | 97 | | MeOH/3 | | BPDA/3.93 | ODA/2.73 | TMU/21 | 3/2.34 | | A | A | A |
| 40 | 97 | | MeOH/3 | | BPDA/3.70 | ODA/2.57 | TMU/21 | 3/2.20 | 1/0.54 | A | A | A |
| 41 | 97 | | MeOH/3 | | BPDA/3.92 | ODA/2.72 | TMU/21 | 4/2.36 | | A | A | A |
| 42 | 97 | | MeOH/3 | | BPDA/4.31 | ODA/2.99 | TMU/21 | 5/1.44 | 2/0.25 | A | A | B |
| 43 | 97 | | MeOH/3 | | BPDA/4.44 | ODA/3.09 | TMU/21 | 6/1.21 | 2/0.26 | A | A | B |
| 44 | 97 | | MeOH/3 | | ODPA/3.00 | BAHF/3.06 | TMU/21 | 7/2.16 | 3/0.24 | A | A | B |
| 45 | 97 | | MeOH/3 | | ODPA/3.04 | BAHF/3.66 | TMU/21 | 7/2.20 | 4/0.11 | A | A | B |
| 46 | 30 | | MeOH/70 | | PMDA/4.19 | ODA/3.92 | TMU/21 | 1/0.88 | | A | B | A |
| 47 | 40 | | MeOH/60 | | PMDA/4.19 | ODA/3.92 | TMU/21 | 1/0.88 | | A | B | A |
| 48 | 50 | | MeOH/50 | | PMDA/4.19 | ODA/3.92 | TMU/21 | 1/0.88 | | A | B | A |

TABLE 3

| Comparative Example | Materials of 100 mass parts of developing solution for polyimide precursor | | | | Materials of photosensitive polyimide precursor resin composition | | | | | Evaluation | | |
|---|---|---|---|---|---|---|---|---|---|---|---|---|
| | (a) TMU (mass parts) | (a') NMP (mass parts) | (b) (kind/mass parts) | (c) (kind/mass parts) | Tetra-carboxylic acid di-anhydride (kind/g) | Diamine (kind/g) | Solvent (kind/g) | Photo-sensitizer (kind/g) | Additive (king/g) | Environmental toxicity | Residual film after development | Development margin |
| 1 | | 75 | MeOH/20 | EGBE/5 | PMDA/4.19 | ODA/3.92 | TMU/21 | 1/0.88 | | C | B | B |
| 2 | | 75 | MeOH/20 | EGBE/5 | BPDA/4.81 | ODA/3.34 | TMU/21 | 2/0.85 | | C | B | B |
| 3 | | 75 | MeOH/20 | EGBE/5 | BPDA/3.93 | ODA/2.73 | TMU/21 | 3/2.34 | | C | B | B |
| 4 | | 75 | MeOH/20 | EGBE/5 | BPDA/3.70 | ODA/2.57 | TMU/21 | 3/2.20 | 1/0.54 | C | B | B |
| 5 | | 75 | MeOH/20 | EGBE/5 | BPDA/3.92 | ODA/2.72 | TMU/21 | 4/2.36 | | C | B | B |
| 6 | | 75 | MeOH/20 | EGBE/5 | BPDA/4.31 | ODA/2.99 | TMU/21 | 5/1.44 | 2/0.25 | C | B | B |
| 7 | | 75 | MeOH/20 | EGBE/5 | BPDA/4.44 | ODA/3.09 | TMU/21 | 6/1.21 | 2/0.26 | C | B | B |
| 8 | | 75 | MeOH/20 | EGBE/5 | ODPA/3.00 | BAHF/3.06 | TMU/21 | 7/2.16 | 3/0.24 | C | B | B |
| 9 | | 75 | MeOH/20 | EGBE/5 | ODPA/3.04 | BAHF/3.66 | TMU/21 | 7/2.20 | 4/0.11 | C | B | B |
| 10 | | 30 | MeOH/45 | EGBE/25 | PMDA/4.19 | ODA/3.92 | TMU/21 | 1/0.88 | | C | A | C |
| 11 | | 30 | MeOH/45 | EGBE/25 | BPDA/4.81 | ODA/3.34 | TMU/21 | 2/0.85 | | C | A | C |
| 12 | | 30 | MeOH/45 | EGBE/25 | BPDA/3.93 | ODA/2.73 | TMU/21 | 3/2.34 | | C | A | C |
| 13 | | 30 | MeOH/45 | EGBE/25 | BPDA/3.70 | ODA/2.57 | TMU/21 | 3/2.20 | 1/0.54 | C | A | C |
| 14 | | 30 | MeOH/45 | EGBE/25 | BPDA/3.92 | ODA/2.72 | TMU/21 | 4/2.36 | | C | A | C |
| 15 | | 30 | MeOH/45 | EGBE/25 | BPDA/4.31 | ODA/2.99 | TMU/21 | 5/1.44 | 2/0.25 | C | A | C |
| 16 | | 30 | MeOH/45 | EGBE/25 | BPDA/4.44 | ODA/3.09 | TMU/21 | 6/1.21 | 2/0.26 | C | A | C |
| 17 | | 30 | MeOH/45 | EGBE/25 | ODPA/3.00 | BAHF/3.06 | TMU/21 | 7/2.16 | 3/0.24 | C | A | C |
| 18 | | 30 | MeOH/45 | EGBE/25 | ODPA/3.04 | BAHF/3.66 | TMU/21 | 7/2.20 | 4/0.11 | C | A | C |
| 19 | | 97 | MeOH/3 | | PMDA/4.19 | ODA/3.92 | TMU/21 | 1/0.88 | | C | C | C |
| 20 | | 97 | MeOH/3 | | BPDA/4.81 | ODA/3.34 | TMU/21 | 2/0.85 | | C | C | C |
| 21 | | 97 | MeOH/3 | | BPDA/3.93 | ODA/2.73 | TMU/21 | 3/2.34 | | C | C | C |
| 22 | | 97 | MeOH/3 | | BPDA/3.70 | ODA/2.57 | TMU/21 | 3/2.20 | 1/0.54 | C | C | C |
| 23 | | 97 | MeOH/3 | | BPDA/3.92 | ODA/2.72 | TMU/21 | 4/2.36 | | C | C | C |
| 24 | | 97 | MeOH/3 | | BPDA/4.31 | ODA/2.99 | TMU/21 | 5/1.44 | 2/0.25 | C | C | C |
| 25 | | 97 | MeOH/3 | | BPDA/4.44 | ODA/3.09 | TMU/21 | 6/1.21 | 2/0.26 | C | C | C |
| 26 | | 97 | MeOH/3 | | ODPA/3.00 | BAHF/3.06 | TMU/21 | 7/2.16 | 3/0.24 | C | C | C |
| 27 | | 97 | MeOH/3 | | ODPA/3.04 | BAHF/3.66 | TMU/21 | 7/2.20 | 4/0.11 | C | C | C |

As shown in Tables 1 to 3, the developing solutions for polyimide precursor containing N,N,N',N'-tetramethylurea according to Examples 1 to 40 were low in the environmental toxicity and small in a decrease of the film thickness of the polyimide-based resin film in the development step and could make the development margin large.

On the other hand, the developing solutions for polyimide precursor containing N-methyl-2-pyrrolidone according to Comparative Examples 1 to 21 were high in the environmental toxicity and involved the case where a decrease of the film thickness of the polyimide-based resin film in the development step was large, or the case where the development margin was small.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A developing solution for a polyimide precursor, consisting of: (a) N,N,N',N'-tetramethylurea; (b) a lower alcohol having 1 to 5 carbon atoms; and (c) a glycol,
wherein (c) the glycol is at least one selected from the group consisting of ethylene glycol, propylene glycol, butylene glycol, diethylene glycol, dipropylene glycol, and dibutylene glycol, and
a blending amount of (c) the glycol is 1 to 10 mass parts based on 100 mass parts of the developing solution.

2. The developing solution for a polyimide precursor according to claim 1, wherein the polyimide precursor is a photosensitive polyimide precursor which is imidized by the action of light.

3. A development processing method of a photosensitive polyimide resin composition, comprising developing a coating film with the developing solution for polyimide precursor according to claim 2,
wherein the coating film is formed by coating a photosensitive polyimide precursor resin composition on a surface of a material to be coated; and
at least a part of the coating film is exposed to a radial ray.

4. A pattern formation method comprising:
forming a coating film of a photosensitive polyimide precursor resin composition by coating the photosensitive polyimide precursor resin composition on a surface of a material to be coated;
selectively exposing at least a part of the coating film to a radial ray; and
developing the exposed coating film by the development processing method according to claim 3.

5. The developing solution for a polyimide precursor according to claim 1, wherein the developing solution does not comprise a solvent other than (a) the N,N,N',N'-tetramethylurea; (b) the lower alcohol having 1 to 5 carbon atoms; and (c) the glycol.

6. The developing solution for a polyimide precursor according to claim 1, wherein (a) the N,N,N',N'-tetramethylurea is 10 to 99 mass parts based on 100 mass parts of the developing solution.

7. A development processing method of a photosensitive polyimide resin composition, comprising developing a coating film with a developing solution, wherein the coating film is formed by coating a photosensitive polyimide precursor resin composition on a surface of a material to be coated;
at least a part of the coating film is exposed to a radial ray; and
the developing solution comprises:
(a) N,N,N',N'-tetramethylurea; (b) a lower alcohol having 1 to 5 carbon atoms; and (c) a glycol and/or a glycol ether, wherein the glycol ether is represented by the following formula (I')

wherein $R^4$ represents an alkylene group having 2 to 5 carbon atoms; and $R^{B1}$ represents an alkyl group having 1 to 4 carbon atoms or an optionally substituted aromatic group, and
a blending amount of (c) the glycol and/or the glycol ether is 1 to 10 mass parts based on 100 mass parts of the developing solution, and
the photosensitive polyimide precursor resin composition comprises a compound represented by the following formula (3):

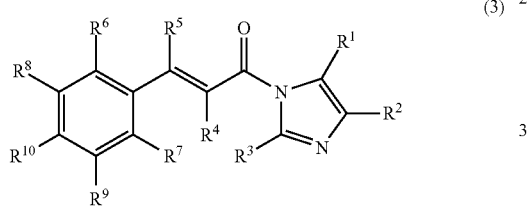

wherein in the formula (3), each of $R^1$, $R^2$, and $R^3$ independently represents a hydrogen atom, a halogen atom, a hydroxyl group, a mercapto group, a sulfide group, a silyl group, a silanol group, a nitro group, a nitroso group, a phosphino group, a sulfonate group, a phosphinyl group, a phosphonate group, or an organic group;
each of $R^4$ and $R^5$ independently represents a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group;
each of $R^6$, $R^7$, $R^8$, $R^9$, and $R^{10}$ independently represents a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group; and
two or more of $R^6$, $R^7$, $R^8$, $R^9$, and $R^{10}$ optionally bond to each other to form a cyclic structure and optionally contain a bond of a hetero group.

8. The development processing method according to claim 7,
wherein (c) the glycol is at least one selected from the group consisting of ethylene glycol, propylene glycol, butylene glycol, diethylene glycol, dipropylene glycol, and dibutylene glycol.

9. The development processing method according to claim 7,
wherein a blending amount of (c) the glycol is 1 to 10 mass parts based on 100 mass parts of the developing solution.

10. The development processing method according to claim 7,
wherein the photosensitive polyimide precursor resin composition comprises a polyimide precursor, and
the polyimide precursor is a photosensitive polyimide precursor which is imidized by the action of a radial ray.

11. The development processing method according to claim 10, wherein the radial ray is light.

12. A pattern formation method comprising:
forming a coating film of a photosensitive polyimide precursor resin composition by coating the photosensitive polyimide precursor resin composition on a surface of a material to be coated;
selectively exposing at least a part of the coating film to a radial ray; and
developing the exposed coating film by the development processing method according to claim 7,
wherein the photosensitive polyimide precursor resin composition comprises a compound represented by the following formula (3):

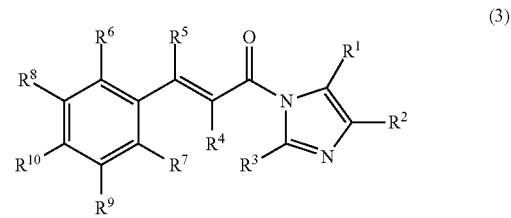

wherein in the formula (3), each of $R^1$, $R^2$, and $R^3$ independently represents a hydrogen atom, a halogen atom, a hydroxyl group, a mercapto group, a sulfide group, a silyl group, a silanol group, a nitro group, a nitroso group, a phosphino group, a sulfonate group, a phosphinyl group, a phosphonate group, or an organic group;
each of $R^4$ and $R^5$ independently represents a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group;
each of $R^6$, $R^7$, $R^8$, $R^9$, and $R^{10}$ independently represents a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group; and
two or more of $R^6$, $R^7$, $R^8$, $R^9$, and $R^{10}$ optionally bond to each other to form a cyclic structure and optionally contain a bond of a hetero group.

13. The pattern formation method according to claim 12,
wherein (c) the glycol is at least one selected from the group consisting of ethylene glycol, propylene glycol, butylene glycol, diethylene glycol, dipropylene glycol, and dibutylene glycol.

14. The pattern formation method according to claim 12, wherein a blending amount of (c) the glycol is 1 to 10 mass parts based on 100 mass parts of the developing solution.

15. The pattern formation method according to claim 12, wherein the photosensitive polyimide precursor resin composition comprises a polyimide precursor, and the polyimide precursor is a photosensitive polyimide precursor which is imidized by the action of a radial ray.

16. The pattern formation method according to claim 15, wherein the radial ray is light.

17. A developing solution for a polyimide precursor, consisting of (a) N,N,N',N'-tetramethylurea, (b) a lower alcohol having 1 to 5 carbon atoms, (c) a glycol, and (d) another component,
wherein the glycol is at least one selected from the group consisting of ethylene glycol, propylene glycol, butylene glycol, diethylene glycol, dipropylene glycol and dibutylene glycol,
a blending amount of the glycol is 1 to 10 mass parts based on 100 mass parts of the developing solution, and
said another component consists of a solvent other than the components (a) to (c) and selected from the group consisting of an alcohol, an ester and a hydrocarbon.

18. The developing solution for the polyimide precursor according to claim 17, wherein the polyimide precursor is a photosensitive polyimide precursor which is imidized by the action of light.

19. The developing solution for the polyimide precursor according to claim 17, wherein the developing solution does not comprise a solvent other than (a) the N,N,N',N'-tetramethylurea, (b) the lower alcohol having 1 to 5 carbon atoms, and (c) the glycol.

20. The developing solution for the polyimide precursor according to claim 17, wherein (a) the N,N,N',N'-tetramethylurea is 10 to 99 mass parts based on 100 mass parts of the developing solution.

* * * * *